(12) United States Patent
Lin et al.

(10) Patent No.: US 8,493,705 B2
(45) Date of Patent: Jul. 23, 2013

(54) ELECTROSTATIC DISCHARGE CIRCUIT FOR RADIO FREQUENCY TRANSMITTERS

(75) Inventors: Chun-Yu Lin, Hualien (TW); Li-Wei Chu, Hsinchu (TW); Ming-Dou Ker, Zhubei (TW); Ming-Hsien Tsai, Sindian (TW); Ping-Fang Hung, Hsinchu (TW); Ming-Hsiang Song, Shin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 265 days.

(21) Appl. No.: 12/982,004

(22) Filed: Dec. 30, 2010

(65) Prior Publication Data
US 2012/0170161 A1 Jul. 5, 2012

(51) Int. Cl.
*H02H 9/04* (2006.01)
*H01L 29/66* (2006.01)

(52) U.S. Cl.
USPC ............. 361/111; 361/56; 257/173; 257/355

(58) Field of Classification Search
USPC ............................ 361/56, 111; 257/173, 355
See application file for complete search history.

(56) References Cited

U.S. PATENT DOCUMENTS

| 5,600,525 | A * | 2/1997 | Avery | 361/56 |
|---|---|---|---|---|
| 5,747,834 | A * | 5/1998 | Chen et al. | 257/111 |
| 6,521,952 | B1 * | 2/2003 | Ker et al. | 257/360 |
| 6,594,132 | B1 * | 7/2003 | Avery | 361/111 |
| 6,624,999 | B1 * | 9/2003 | Johnson | 361/113 |
| 6,894,321 | B2 * | 5/2005 | Morishita | 257/173 |
| 7,102,864 | B2 * | 9/2006 | Liu et al. | 361/56 |
| 7,280,330 | B2 * | 10/2007 | Oguzman et al. | 361/56 |
| 7,518,841 | B2 | 4/2009 | Chuang et al. | |
| 7,615,417 | B2 * | 11/2009 | Manna et al. | 438/133 |
| 2007/0223157 | A1 | 9/2007 | Chen et al. | |

OTHER PUBLICATIONS

Shiu, Y.D. et al., "CMOS Power Amplifier with ESD Protection Design Merged in Matching Network", Proc. IEEE International Conference on Electronics, Circuits and Systems, Dec. 2007, pp. 825-828.
Thijs, S., et al., CDM and HBM Analysis of ESD Protected 60 GHz Power Amplifier in 45 nm Low-Power Digital CMOS, Proc. EOS/ESD Symposium, Sep. 2009, pp. 1-5.

* cited by examiner

*Primary Examiner* — Rexford Barnie
*Assistant Examiner* — Zee V Kitov
(74) *Attorney, Agent, or Firm* — Duane Morris LLP

(57) ABSTRACT

A representative electrostatic discharge (ESD) protection circuit includes a silicon-controlled rectifier (SCR) that is electrically coupled to the output of a power amplifier; an ESD detection circuit that triggers the SCR responsive to detect an electrostatic discharge on an ESD bus; and an ESD clamp circuit that is coupled to the first voltage line.

22 Claims, 8 Drawing Sheets

ELECTROSTATIC DISCHARGE CIRCUIT FOR RADIO FREQUENCY TRANSMITTERS

TECHNICAL FIELD

The present disclosure is generally related to electrical circuits, and particularly to electrostatic discharge protection circuits.

BACKGROUND

A radio frequency (RF) transmitter connected to an antenna is susceptible to damaging electrostatic discharge (ESD) pulses received from its operating environment. As integrated circuits, including RF transmitters, are made smaller in physical size, the integrated circuits become more susceptible to ESD because of smaller fabrication geometry.

BRIEF DESCRIPTION OF DRAWINGS

The accompanying drawings illustrate preferred embodiments of the invention, as well as other information pertinent to the disclosure, in which.

DETAILED DESCRIPTION

Figure 1:
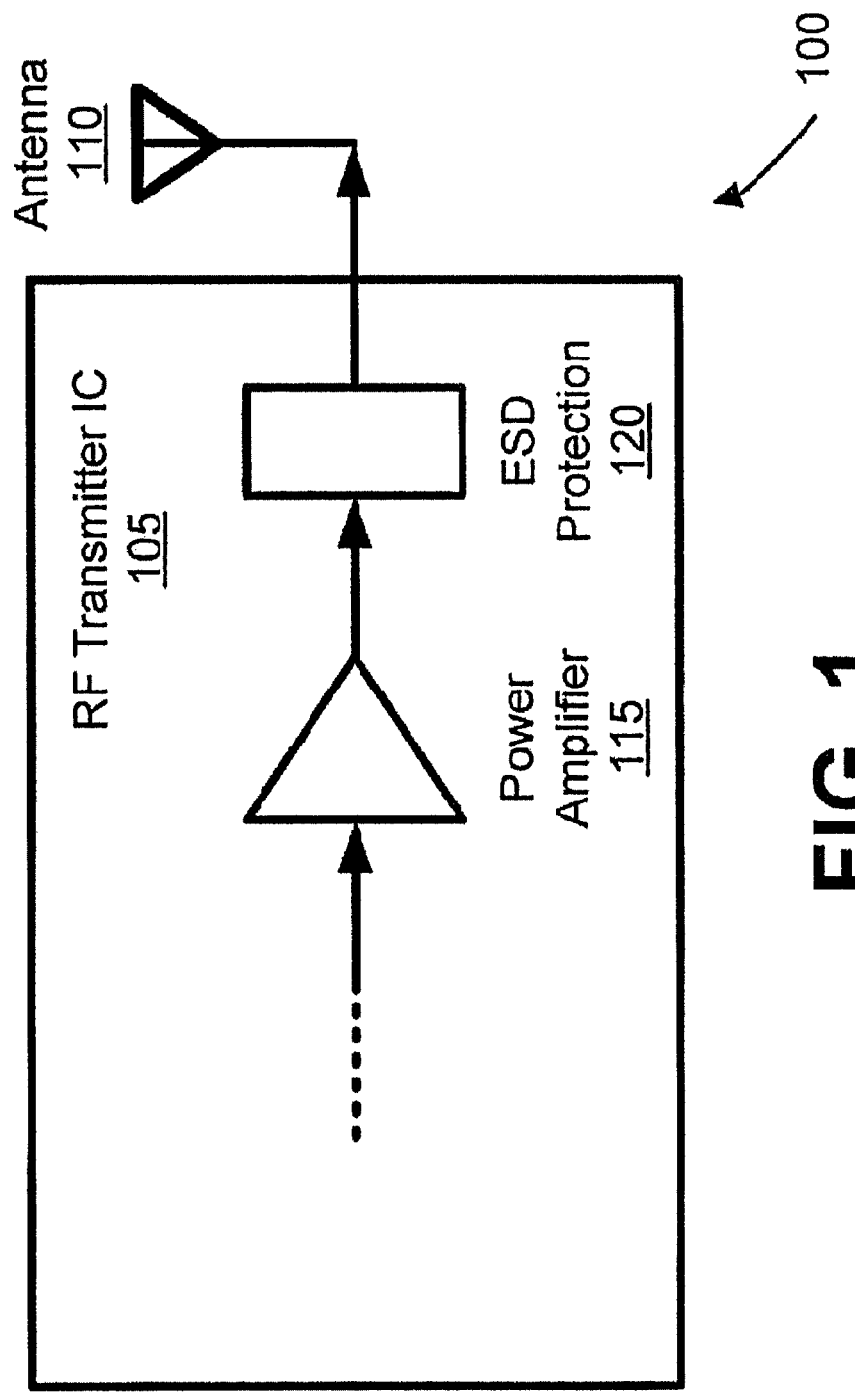
FIG. 1 is a block diagram that illustrates a radio frequency transmitter having an electrostatic discharge protection circuit in accordance with an embodiment of the disclosure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning electrical communications and the like, such as, "coupled" and "electrically coupled" or "electrically connected," refer to a relationship wherein nodes communicate with one another either directly or indirectly through intervening structures, unless otherwise stated or necessary to the operation described.

Figure 2:
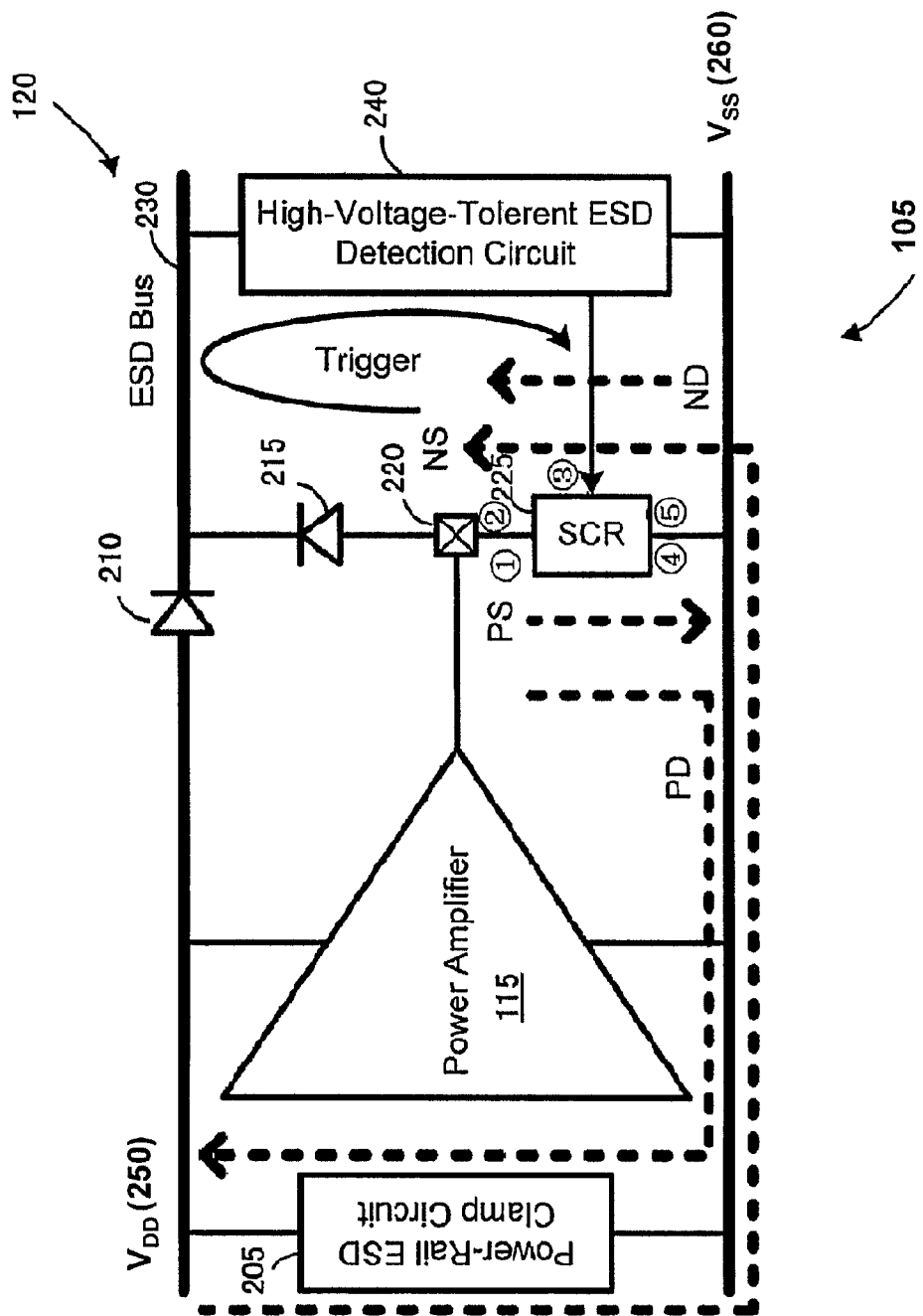
FIG. 2 is a block diagram that illustrates an electrostatic discharge protection circuit for radio frequency circuits in accordance with an embodiment of the disclosure.

FIG. 1 is a block diagram that illustrates a radio frequency (RF) transmitter 100 having an electrostatic discharge (ESD) protection circuit 120 in accordance with an embodiment of the disclosure. The RF transmitter 100 can include an RF transmitter integrated chip 105 that includes a power amplifier 115 and an ESD protection circuit 120. The power amplifier 115 receives an input such as an RF signal and outputs an RF signal to the ESD protection circuit 120, which couple the RF signals to an antenna 110 for transmission. In general, the ESD protection circuit 120 controllably diverts the energy of an electrostatic discharge received by the RF transmitter 100, away from other components of the RF transmitter 100. Advantageously, the ESD protection circuit has little to no signal leakage or loading on an output of the power amplifier 115 to a voltage line, e.g., $V_{DD}$ (FIG. 2). The ESD protection circuit 120 is further described in connection with FIGS. 2-8.

FIG. 2 is a block diagram that illustrates an electrostatic discharge protection circuit 120A for radio frequency circuits in accordance with an embodiment of the disclosure. The ESD protection circuit 120A includes a power-rail ESD clamp circuit 205, and a high-voltage-tolerant ESD detection circuit 240, a diode 210, a diode 215, and a silicon-controlled rectifier (SCR) 225. The power-rail ESD clamp circuit 205, the high-voltage-tolerant ESD detection circuit 240, the diode 210, the diode 215, and the SCR 225 are further coupled between $V_{DD}$ 250 and $V_{SS}$ 260, ESD bus 230 and $V_{SS}$ 260, $V_{DD}$ 250 and ESD bus 230, RF output 220 and ESD bus 230, RF output 220 and $V_{SS}$ 260, respectively. The ESD protection circuit 120A detects ESD and discharges ESD energy away from protected components, for example, of an RF transmitter 100 (FIG. 1). Diode 210 is coupled in series along the $V_{DD}$ line to an ESD bus 230, which is an internal metal line in an IC layout, which may not need to be connected to an external pin(s). The diode 210 can separate the electrical connection between $V_{DD}$ 250 and the ESD bus 230.

In this embodiment, the ESD protection circuit 120A includes a silicon-controlled rectifier (SCR) 225 coupled across RF output 220 (namely the output of the power amplifier 115) and in series with a diode 215, the SCR and diode being coupled between ESD bus and $V_{SS}$. The diode 215 is electrically coupled between the RF output 220 and the ESD bus 230. The diode 215 is biased to conduct current from the RF output 220 to the ESD bus 230.

Figure 3:
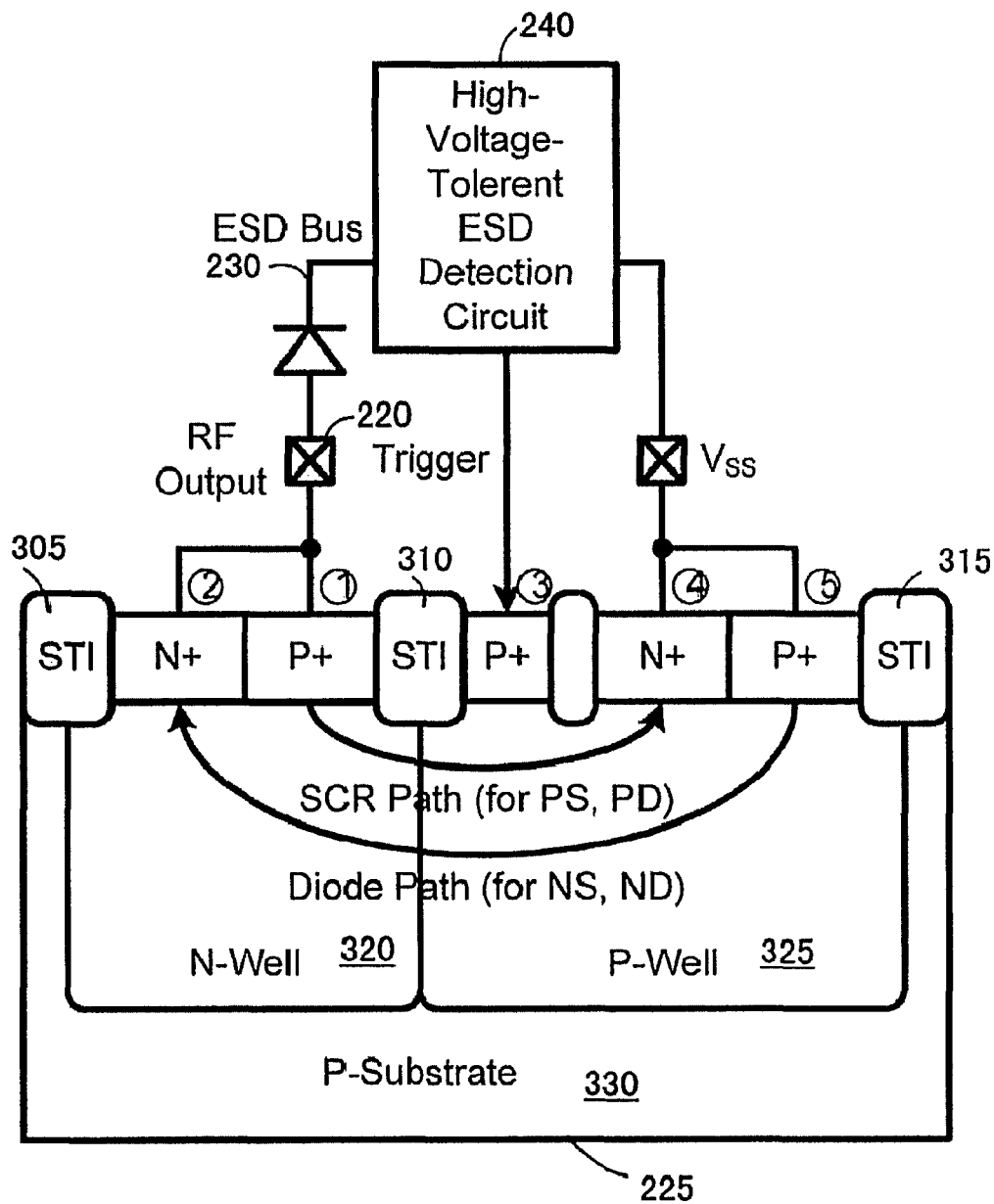
FIG. 3 illustrates an example of a structure of a silicon-controlled rectifier that is coupled to an ESD detection circuit, such as that shown in FIG. 2.

An example of the SCR 225 as shown in FIG. 3 includes multiple layers of P-type and N-type semiconductor materials, e.g., NPPNP layer pellets 2, 1, 3, 4, 5. The N+ and P+ semiconductor materials 2, 1 can be referred to as an anode of the SCR 225 and the N+ and P+ semiconductor materials 4, 5 can be referred to as a cathode of the SCR 225. By applying current from a biased source to the P+ semiconductor material 3 of the SCR 225, current received at the P+ semiconductor materials 1 is conducted across the SCR 225 to the N+ semiconductor material 4. This is the mechanism by which SCR conduction is "triggered." The SCR 225 shortens an ESD current path to $V_{SS}$ during positive excursions, clamping the voltage near a minimum of $V_{SS}$ during ESD stresses, provided that the SCR 225 has been triggered. Also, a turn-on voltage of the SCR 225 can be reduced to effectively protect the power amplifier 115.

Under all ESD stress conditions, the ESD protection circuit 120A provides multiple paths with good ESD robustness. The multiple paths include positive-to-$V_{SS}$ (PS) path, positive-to-$V_{DD}$ (PD) path, negative-to-$V_{SS}$ (NS) path, and negative-to-$V_{DD}$ (ND) path. The SCR 225 has very high ESD robustness due to its low clamping voltage under ESD stress conditions. The ESD detection circuit 240 triggers the SCR 225 responsive to detecting an electrostatic discharge on a voltage line, either $V_{DD}$ or $V_{SS}$. The SCR 225 of the ESD protection circuit 120A is further described in connection to FIG. 3.

FIG. 3 illustrates a structure of an SCR 225 that is coupled to an ESD detection circuit 240, such as that shown in FIG. 2. The SCR 225 includes multiple layers of P- and N-type semiconductor materials, e.g., NPPPN layer pellets having reference numerals 2, 1, 3, 4, 5, respectively. In this example, the SCR 225 includes a P-substrate 330 having N- and P-well regions 320, 325 formed in the P-substrate 330. The N- and P-well regions 320, 325 have implanted P+ and N+ regions 2, 1, 3, 4, 5 and shallow trench isolations (STIs) 305, 310, 315 separating semiconductor materials 2, 1, 3, 4, 5 in the N- and P-well regions 320, 325. The RF output 220 is electrically coupled to the N+ and P+ semiconductor materials 2, 1. $V_{SS}$ is electrically coupled to the N+ and P+ semiconductor materials 4, 5. The SCR 225 conducts current from the RF output 220 to $V_{SS}$ by way of an SCR path for the positive-to-$V_{SS}$ (PS) and the positive-to-$V_{DD}$ (PD) responsive to detecting an electrostatic discharge at the RF output 220. The SCR 225 can be designed to divert the electrostatic discharge away from other electrical components by conducting current from the RF output 220 to $V_{SS}$ responsive to the SCR 225 being triggered. The SCR 225 can be triggered by the electrostatic discharge reaching a certain level. If negative electrostatic discharge is detected, the SCR 225 conducts current from $V_{SS}$ to the RF output by way of a diode path for the negative-to-$V_{SS}$ (NS), and negative-to-$V_{DD}$ (ND). In other words, if the negative voltage is applied on the SCR 225, the parasitic diode in the SCR 225 can be forward biased to clamp the negative voltage at a low voltage level.

Figure 4:
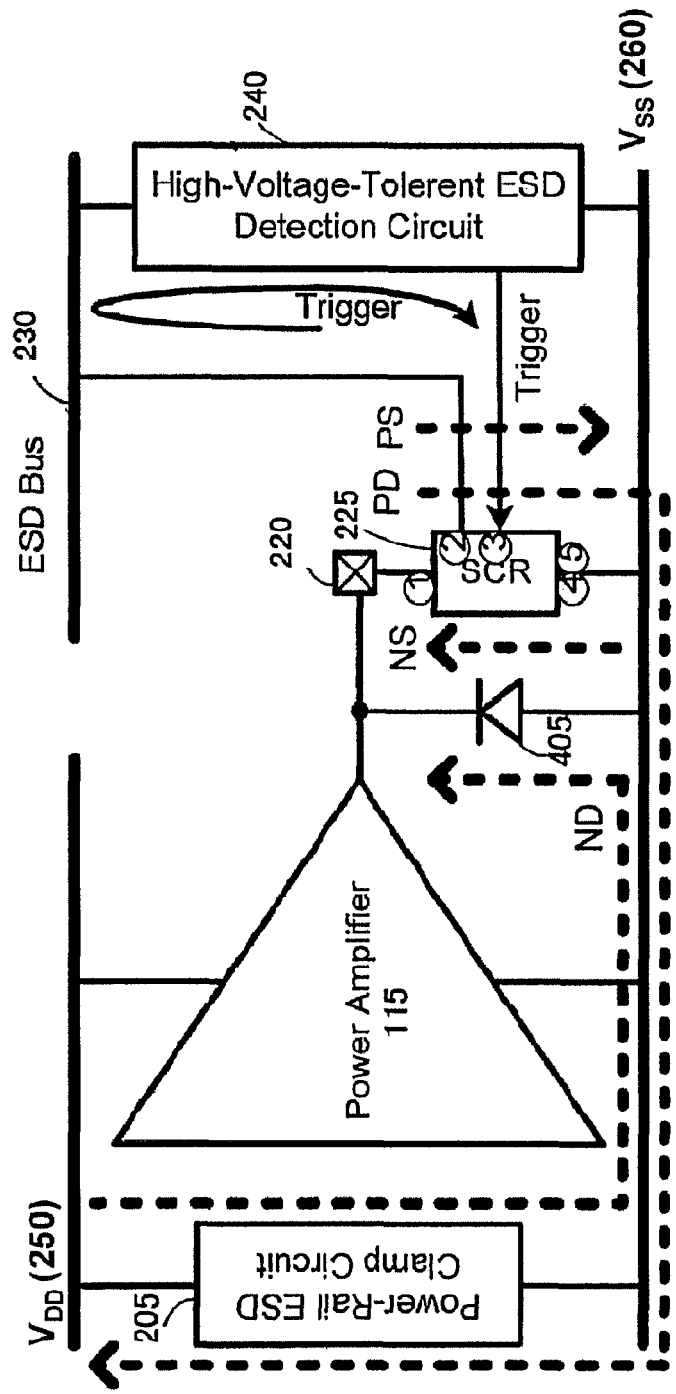
FIG. 4 is a block diagram that illustrates an electrostatic discharge protection circuit for radio frequency circuits in accordance with another embodiment of the disclosure.

FIG. 4 is a block diagram that illustrates an ESD protection circuit 120B for radio frequency circuits in accordance with another embodiment of the disclosure. The architecture of the ESD protection circuit 120B is similar to the architecture of the ESD protection circuit 120A in FIG. 2. Accordingly, like features are labeled with the same reference numbers, such as the power amplifier 115, ESD clamp circuit 205, RF output 220, SCR 225, ESD bus 230, ESD detection circuit 240, $V_{SS}$, and $V_{DD}$. The ESD protection circuit 120B, however, further includes an extra line connecting the N+ semiconductor material 2 to the ESD bus 230 and a diode 405 that is coupled in parallel with the SCR 225 between the RF output 220 and $V_{SS}$. By applying current from the biased source to the P+ semiconductor material 3 of the SCR 225, current received at the P+ semiconductor materials 1 is conducted across the SCR 225 to the N+ semiconductor material 4. The ESD protection circuit 120B can provide similar ESD protection paths as the ESD protection circuit 120A, which include positive-to-$V_{SS}$ (PS) path, positive-to-$V_{DD}$ (PD) path, negative-to-$V_{SS}$ (NS) path, and negative-to-$V_{DD}$ (ND) path. The SCR 225 of the ESD protection circuit 120B is further described in connection to FIG. 5.

Figure 5:
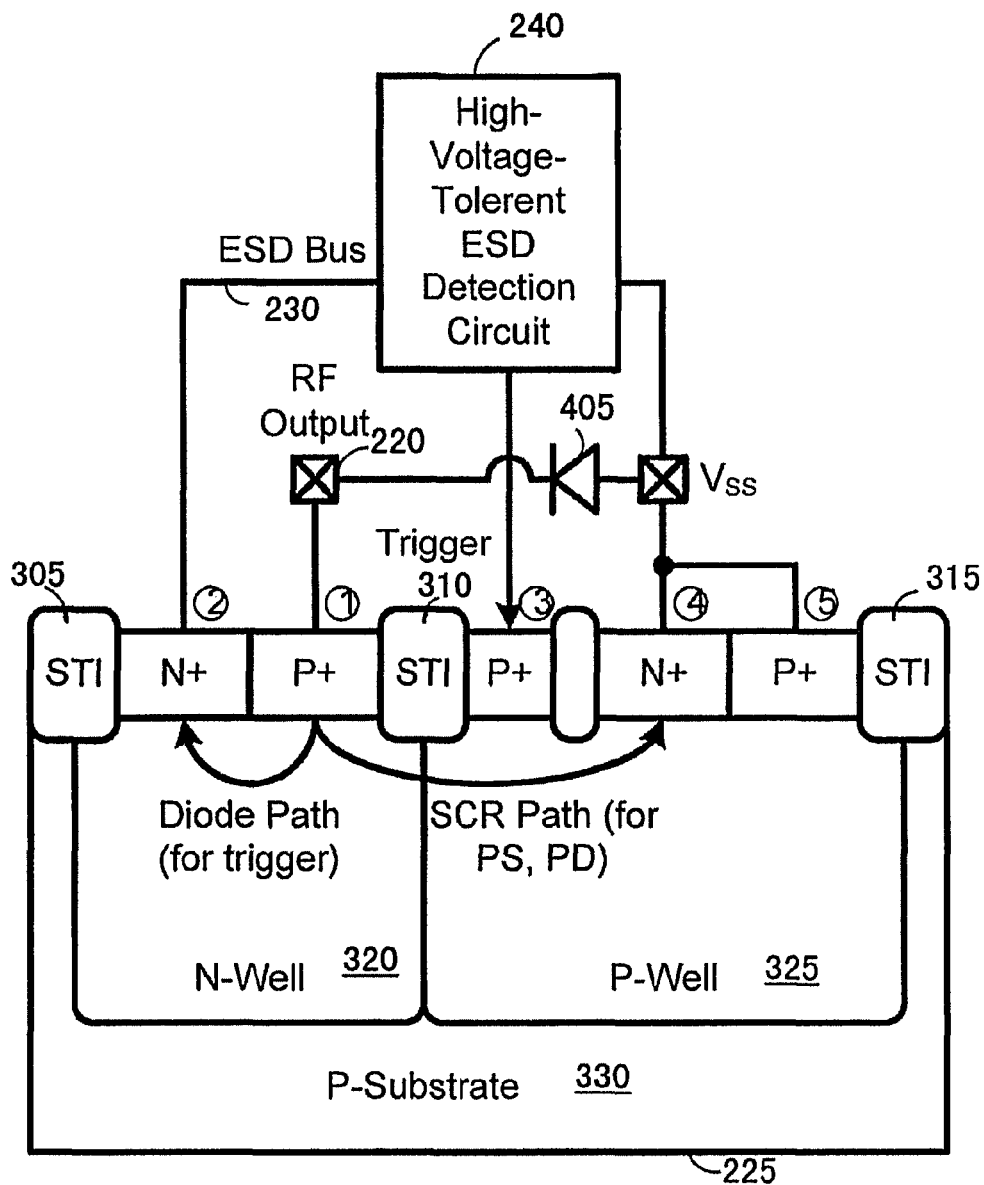
FIG. 5 illustrates a silicon-controlled rectifier that is coupled to an ESD detection circuit, such as that shown in FIG. 4.

FIG. 5 illustrates a structure of an SCR 225 that is coupled to an ESD detection circuit 240, such as that shown in FIG. 4. The structure of the SCR 225 of the ESD protection circuit 120A is similar to the structure of the SCR 225 of the ESD protection circuit 120A. Accordingly, like features are labeled with the same reference numbers, such as the ESD clamp circuit 205, RF output 220, ESD bus 230, ESD detection circuit 240, $V_{SS}$, $V_{DD}$, NPPPN layer pellets 2, 1, 3, 4, 5, shallow trench isolations (STIs) 305, 310, 315, N- and P-well regions 320, 325, and P-substrate 330. The ESD protection circuit 120B, however, further includes a diode 405 that is coupled between the RF output 220 and $V_{SS}$. The SCR 225 conducts current from the RF output 220 to $V_{SS}$ by way of an SCR path for the positive-to-$V_{SS}$ (PS) and the positive-to-$V_{DD}$ (PD) responsive to detecting an electrostatic discharge at the RF output 220.

The SCR 225 can be designed such the electrostatic discharge at a certain level can trigger the SCR 225 such that current is conducted from the RF output 220 to the P+ semiconductor material 1 to the N+ semiconductor material 4 and to $V_{SS}$, diverting the electrostatic discharge away from other electrical components. If negative electrostatic discharge is detected, the diode 405 conducts current from $V_{SS}$ to the RF output 220, which triggers as sufficient voltage (e.g., +0.7V) is applied across the RF output 220 to the P+ semiconductor material 1 to the N+ semiconductor material 2, and to the ESD bus 230 via a diode path. The ESD detection circuit 240 triggers the SCR 225 based on the detected positive electrostatic discharge. Responsive to receiving the trigger signal from the ESD detection circuit 240, the SCR 225 conducts current from the RF output 220 to the P+ semiconductor material 1 to the N+ semiconductor material 4, and to $V_{SS}$ by way of the SCR path for the positive-to-$V_{SS}$ (PS) and the positive-to-$V_{DD}$ (PD) paths.

Figure 6:
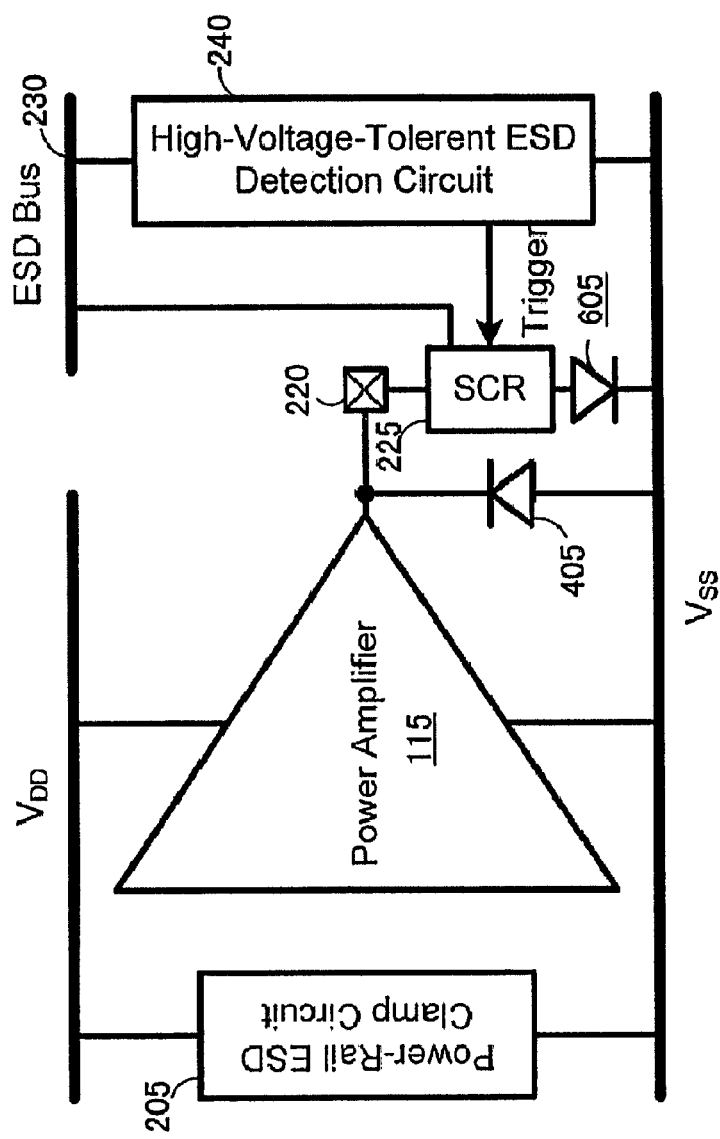
FIG. 6 is a block diagram that illustrates an electrostatic discharge protection circuit for radio frequency circuits in accordance with yet another embodiment of the disclosure.
Figure 7:
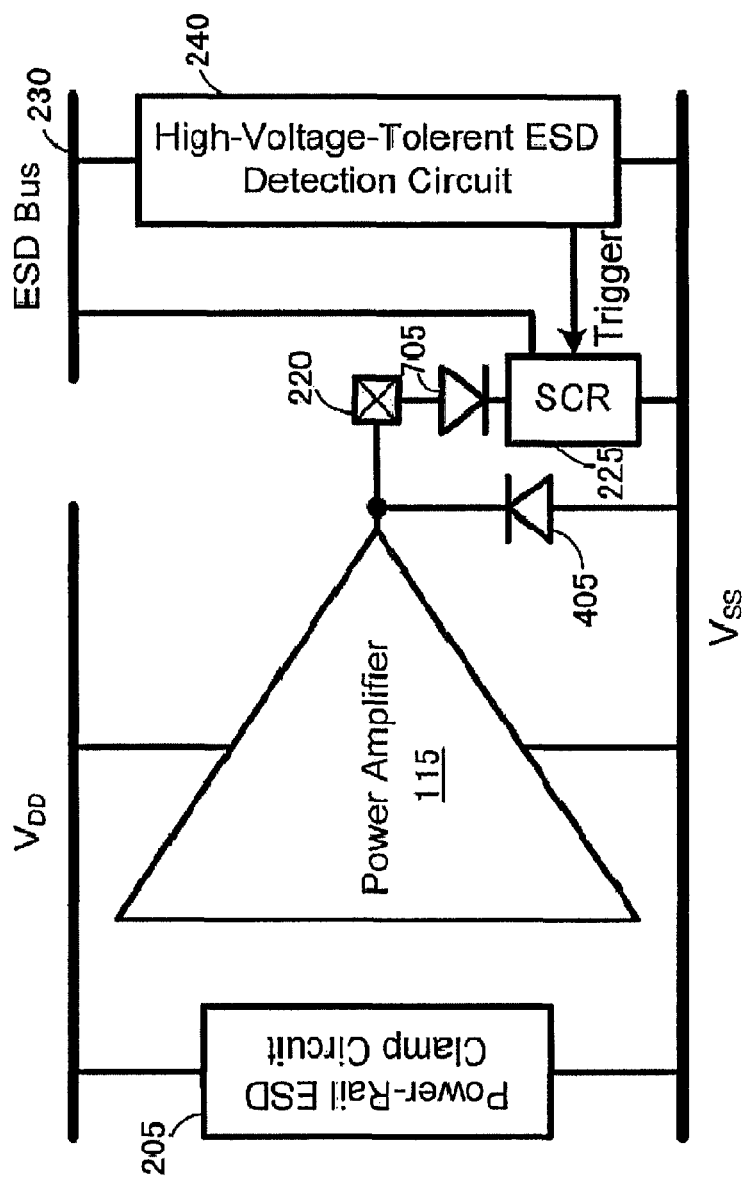
FIG. 7 is a block diagram that illustrates an electrostatic discharge protection circuit for radio frequency circuits in accordance with still another embodiment of the disclosure.

FIGS. 6 and 7 are block diagrams that illustrate electrostatic discharge protection circuit's 120C, D for radio frequency circuits in accordance with additional example of embodiments of the disclosure. The architecture of the ESD protection circuit's 120C, D is similar to the architecture of the ESD protection circuit 120B. Accordingly, like features are labeled with the same reference numbers, such as the power amplifier 115, ESD clamp circuit 205, RF output 220, SCR 225, ESD bus 230, ESD detection circuit 240, $V_{SS}$, $V_{DD}$, and diode 405. The ESD protection circuit 120C in FIG. 6 further includes a diode 605 that is coupled between the SCR 225 and $V_{SS}$. The diode 605 conducts current in one direction from the SCR 225 to $V_{SS}$. The ESD protection circuit 120D in FIG. 7, however, further includes a diode 705 that is coupled between the RF output 220 and the SCR 225. The diode 705 conducts current in one direction from the RF output 220 to SCR 225.

Figure 8:
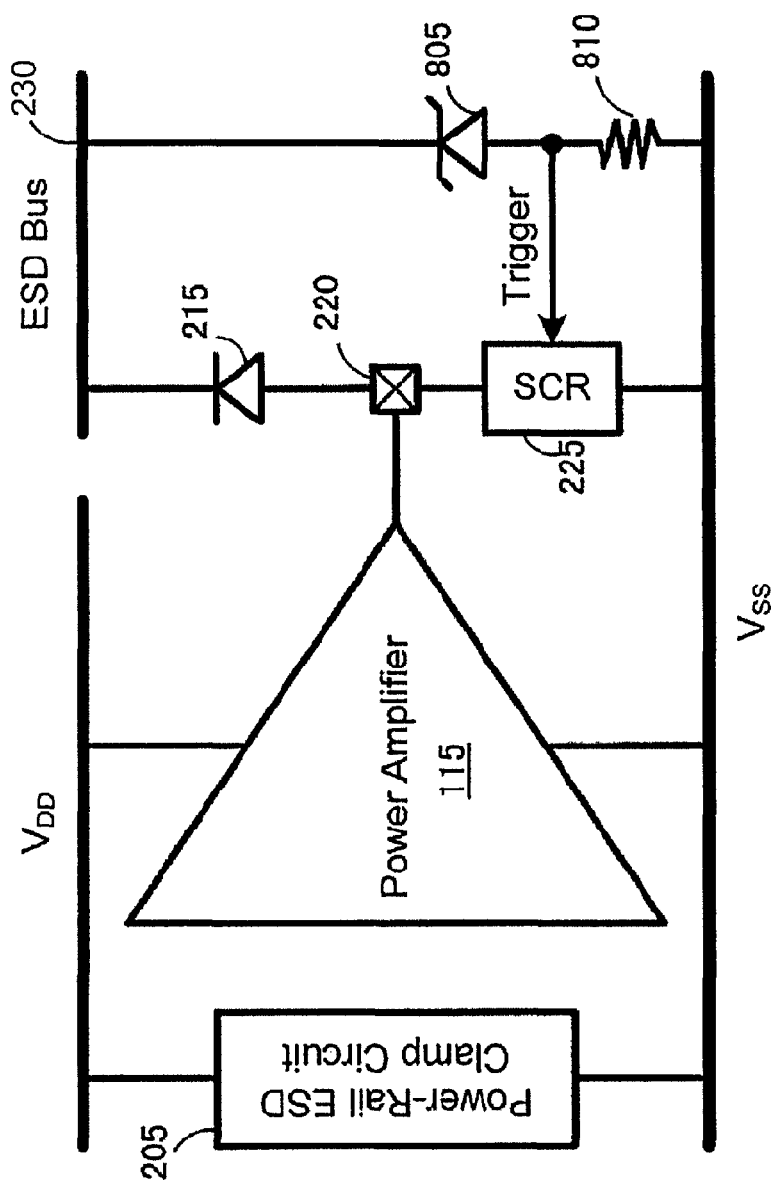
FIG. 8 is a block diagram that illustrates an electrostatic discharge protection circuit for radio frequency circuits in accordance with yet another embodiment of the disclosure.

FIG. 8 is a block diagram that illustrates an example of an electrostatic discharge protection circuit 120E for radio frequency circuits in accordance with yet another embodiment of the disclosure. The architecture of the ESD protection circuit 120E is similar to the architecture of the ESD protection circuit 120A in FIG. 2. Accordingly, like features are labeled with the same reference numbers, such as the power amplifier 115, ESD clamp circuit 205, RF output 220, SCR 225, diode 215, ESD bus 230, $V_{SS}$, and $V_{DD}$. The ESD protection circuit 120B, however, further includes a zener diode 805 and a resistor 810 that are coupled in series between the ESD bus 230 and $V_{SS}$. The zener diode 805 permits current not only in the forward direction like a normal diode, but also in the reverse direction when the reverse bias voltage exceeds a characteristic breakdown voltage. The resistor 810 in series with the zener diode 805 produces a voltage drop that is proportional to the electric current passing through the resistor 810 in accordance with Ohm's law. Thus when the zener conducts at a voltage exceeding its breakdown voltage, a voltage across resistor 810 is applied to the trigger input of SCR 225. Both devices can be integrated in an IC. In this way, the zener diode 805 senses excess voltage and current passing through the zener diode 805 provides an input voltage to trigger the SCR 225.

As described herein, the ESD protection circuits 120A-E include the SCR 225 that is electrically coupled to the output of the power amplifier 115; an ESD detection circuit 240 that triggers the SCR 225 responsive to detecting an electrostatic discharge appearing as a voltage spike on $V_{DD}$ and/or $V_{SS}$, and the ESD clamp circuit 205 that is coupled to $V_{DD}$ and/or $V_{SS}$. The SCR 225 is used to short or shunt an ESD current path and lower the clamping voltage during ESD stresses. Also, a turn-on voltage of the SCR 225 can be reduced to effectively protect the power amplifier 115 by way of the SCR 225 clamping the output 220 to a limited voltage difference lower than $V_{SS}$ and the diode 215 clamping the output 220 to a limited voltage greater than $V_{DD}$. The ESD protection circuits 120A-E having the SCR 225 improve the ESD robustness at the RF transmitter 100 and can easily be used to protect the RF transmitter 100 from electrostatic discharge pulses.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as are suited to the particular use contemplated. All such modifications and variation are within the scope of this disclosure, as determined by the appended claims when interpreted in accordance with the breadth to which they are fairly and legally entitled.

What is claimed is:

1. A radio frequency (RF) transmitter comprising:
   a power amplifier having an input that is configured to receive RF signals and an output that is configured to transmit the amplified RF signals to an antenna; and
   an electrostatic discharge (ESD) protection circuit that is electrically coupled to the output of the power amplifier, wherein the ESD protection circuit includes
      a silicon-controlled rectifier (SCR) that is electrically coupled to the output of the power amplifier,
      an ESD detection circuit that is configured to trigger the SCR responsive to detecting an electrostatic discharge on an ESD bus,
      an ESD clamp circuit that is coupled to the first voltage line;
      at least one ESD component electrically coupled between the ESD bus and the first voltage line; and
      at least one ESD component coupled between the SCR and a second voltage line having a lower voltage value than the first voltage line.

2. The RF transmitter of claim 1, wherein the SCR comprises:
   an alternating arrangement of a first N-type semiconductor material, a first P-type semiconductor material, a second P-type semiconductor material, a second N-type semiconductor material and a third P-type semiconductor material, wherein shallow trench isolations (STIs) are located at the ends of the alternating arrangement and between the first P-type semiconductor material and the second P-type semiconductor material, wherein the output of the power amplifier, the ESD detection circuit, and a second voltage line are electrically coupled to the first P-type semiconductor material, the second P-type semiconductor material, and the second N-type and third P-type semiconductor material, respectively.

3. The RF transmitter of claim 1, wherein the first P-type and first N-type semiconductor materials are implanted in an N-well and the second P-type, second N-type and third P-type semiconductor materials are implanted in a P-well, wherein both the N-well and the P-well are formed in a P substrate.

4. The RF transmitter of claim 2, wherein the ESD bus is coupled between the SCR and the ESD detection circuit.

5. The RF transmitter of claim 4, wherein the ESD bus is electrically coupled between the first N-type semiconductor material of the SCR and the ESD detection circuit.

6. The RF transmitter of claim 4, further comprising at least one ESD component that is electrically coupled between the output of the power amplifier and the ESD bus.

7. The RF transmitter of claim 1, further comprising at least one ESD component that is electrically coupled between the output of the power amplifier and the SCR.

8. The RF transmitter of claim 1, wherein the ESD detection circuit includes a zener diode and a resistor that are coupled in series between the ESD bus and a second voltage line, wherein the ESD bus has a higher voltage value than the second voltage line, wherein the SCR is triggered from a signal at a node between the zener diode and the resistor responsive to detect the electrostatic discharge on either the ESD bus or the second voltage line.

9. An electrostatic discharge (ESD) protection circuit comprising:
   a power amplifier coupled to a first voltage line and to a second voltage line;
   a silicon-controlled rectifier (SCR) that is coupled directly to the output of the power amplifier and to the second voltage line;
   an ESD detection circuit that is coupled directly to and configured to trigger the SCR in response to detecting an electrostatic discharge on an ESD bus; and
   an ESD clamp circuit that is coupled to the first voltage line and to a second voltage line such that the ESD clamp circuit is disposed in parallel with the power amplifier.

10. The ESD protection circuit of claim 9, wherein the SCR comprises:
    an alternating arrangement of a first N-type semiconductor material, a first P-type semiconductor material, a second P-type semiconductor material, a second N-type semiconductor material and a third P-type semiconductor material, wherein shallow trench isolations (STIs) are located at the ends of the alternating arrangement and between the first P-type semiconductor material and the second P-type semiconductor material, wherein the output of the power amplifier, the ESD detection circuit, and a second voltage line are electrically coupled to the first P-type semiconductor material, the second P-type semiconductor material, and the second N-type and third P-type semiconductor material, respectively.

11. The ESD protection circuit of claim 9, wherein the first P-type and second P-type semiconductor materials are implanted in an N-well and the second P-type, second N-type and third P-type semiconductor materials are implanted in a P-well, wherein both the N-well and the P-well are formed in a P substrate.

12. The ESD protection circuit of claim 10, wherein the ESD bus is coupled between the SCR and the ESD detection circuit.

13. The ESD protection circuit of claim 12, further comprising at least one ESD component that is electrically coupled between the output of the power amplifier and the second voltage line.

14. The ESD protection circuit of claim 10, further comprising at least one ESD component that is electrically coupled between the output of the ESD bus and the first voltage line.

15. The ESD protection circuit of claim 14, further comprising at least one ESD component that is electrically coupled between the SCR and a second voltage line, wherein the first voltage line has a higher voltage value than the second voltage line.

16. The ESD protection circuit of claim 9, wherein the ESD detection circuit includes a zener diode and a resistor that are coupled in series between the ESD bus and a second voltage line, wherein the SCR is triggered from a signal at a node between the zener diode and the resistor responsive to detecting the electrostatic discharge on either the ESD bus or the second voltage line.

17. An electronic device comprising:
a power amplifier having an input that is configured to receive and to amplify RF signals and an output that is configured to transmit the amplified RF signals; and
an electrostatic discharge (ESD) protection circuit that is electrically coupled to the output of the power amplifier, wherein the ESD protection circuit includes:
   a silicon-controlled rectifier (SCR) that is coupled directly to the output of the power amplifier and to a second voltage line,
   an ESD detection circuit that is coupled directly to and is configured to trigger the SCR responsive to detecting an electrostatic discharge on an ESD bus,
   an ESD clamp circuit that is coupled to the first voltage line and to the second voltage line such that the ESD clamp circuit is disposed in parallel with power amplifier, ESD detection circuit, and the SCR, and
   at least one ESD component coupled between the ESD bus and a node at which the output of the power amplifier and the SCR are coupled directly.

18. The electronic device of claim 17, wherein the SCR comprises:
an alternating arrangement of a first N-type semiconductor material, a first P-type semiconductor material, a second P-type semiconductor material, a second N-type semiconductor material and a third P-type semiconductor material, wherein shallow trench isolations (STIs) are located at the ends of the alternating arrangement and between the first P-type semiconductor material and the second P-type semiconductor material, wherein the output of the power amplifier, the ESD detection circuit, and a second voltage line are electrically coupled to the first P-type semiconductor material, the second P-type semiconductor material, and the second N-type and third P-type semiconductor material, respectively.

19. The electronic device of claim 17, wherein the first P-type and first N-type semiconductor materials are implanted in an N-well and the second P-type, second N-type and third P-type semiconductor materials are implanted in a P-well, wherein both the N-well and the P-well are formed in a P substrate.

20. The electronic device of claim 18, wherein the ESD bus is coupled between the at least one ESD component and the ESD detection circuit.

21. An electrostatic discharge (ESD) protection circuit comprising:
a silicon-controlled rectifier (SCR) that is electrically coupled to the output of a power amplifier;
an ESD detection circuit configured to trigger the SCR in response to detecting an electrostatic discharge on an ESD bus;
an ESD clamp circuit coupled to a first voltage line; and
at least one ESD component that is electrically coupled between the output of the power amplifier and a second voltage line,
wherein the ESD bus is coupled between the SCR and the ESD detection circuit, and
wherein the SCR comprises an alternating arrangement of a first N-type semiconductor material, a first P-type semiconductor material, a second P-type semiconductor material, a second N-type semiconductor material and a third P-type semiconductor material, wherein shallow trench isolations (STIs) are located at the ends of the alternating arrangement and between the first P-type semiconductor material and the second P-type semiconductor material, wherein the output of the power amplifier, the ESD detection circuit, and a second voltage line are electrically coupled to the first P-type semiconductor material, the second P-type semiconductor material, and the second N-type and third P-type semiconductor material, respectively.

22. An electrostatic discharge (ESD) protection circuit comprising:
a silicon-controlled rectifier (SCR) that is electrically coupled to the output of a power amplifier;
an ESD detection circuit configured to trigger the SCR in response to detecting an electrostatic discharge on an ESD bus;
an ESD clamp circuit coupled to a first voltage line;
at least one ESD component that is electrically coupled between the output of the ESD bus and the first voltage line; and
at least one ESD component that is electrically coupled between the SCR and a second voltage line,
wherein the first voltage line has a higher voltage value than the second voltage line, and
wherein the SCR comprises an alternating arrangement of a first N-type semiconductor material, a first P-type semiconductor material, a second P-type semiconductor material, a second N-type semiconductor material and a third P-type semiconductor material, wherein shallow trench isolations (STIs) are located at the ends of the alternating arrangement and between the first P-type semiconductor material and the second P-type semiconductor material, wherein the output of the power amplifier, the ESD detection circuit, and a second voltage line are electrically coupled to the first P-type semiconductor material, the second P-type semiconductor material, and the second N-type and third P-type semiconductor material, respectively.

* * * * *